US009570672B2

(12) United States Patent
Chen et al.

(10) Patent No.: US 9,570,672 B2
(45) Date of Patent: Feb. 14, 2017

(54) METHOD OF MAKING CURRENT SENSORS

(71) Applicant: Melexis Technologies SA, Bevaix (CH)

(72) Inventors: Jian Chen, Helst op den Berg (BE);
Robert Racz, Zug (CH)

(73) Assignee: Melexis Technologies SA, Bevaix (CH)

( * ) Notice: Subject to any disclaimer, the term of this patent is extended or adjusted under 35 U.S.C. 154(b) by 0 days.

(21) Appl. No.: 15/003,608

(22) Filed: Jan. 21, 2016

(65) Prior Publication Data
US 2016/0218276 A1 Jul. 28, 2016

(30) Foreign Application Priority Data

Jan. 22, 2015 (CH) ........................................ 0079/15

(51) Int. Cl.
| | |
|---|---|
| *H01L 21/00* | (2006.01) |
| *H01L 43/04* | (2006.01) |
| *B29C 45/14* | (2006.01) |
| *G01R 33/00* | (2006.01) |
| *H01L 21/56* | (2006.01) |
| *H01L 25/16* | (2006.01) |
| *H01L 43/06* | (2006.01) |

(Continued)

(52) U.S. Cl.
CPC ............... *H01L 43/04* (2013.01); *B29C 45/14* (2013.01); *G01R 33/0047* (2013.01); *G01R 33/072* (2013.01); *H01L 21/56* (2013.01); *H01L 25/16* (2013.01); *H01L 43/06* (2013.01); *H01L 43/12* (2013.01); *H01L 2224/05554* (2013.01); *H01L 2224/48247* (2013.01); *H01L 2224/49171* (2013.01); *H01L 2924/0002* (2013.01); *H01L 2924/19105* (2013.01)

(58) Field of Classification Search
USPC ..................................... 438/106, 3, 112, 123
See application file for complete search history.

(56) References Cited

U.S. PATENT DOCUMENTS

2004/0080308 A1   4/2004  Goto
2005/0161809 A1   7/2005  Nakatsu et al.
(Continued)

FOREIGN PATENT DOCUMENTS

| DE | 10 2005 029 464 A1 | 12/2006 |
|---|---|---|
| JP | 2012-229950 A | 11/2012 |
| WO | 99/14605 A1 | 3/1999 |

OTHER PUBLICATIONS

European Search Report in European Application No. 16 15 0995, dated Jun. 20, 2016.

*Primary Examiner* — Timor Karimy
(74) *Attorney, Agent, or Firm* — Nixon Peabody LLP

(57) ABSTRACT

The invention relates to a method for the production of current sensors which comprise a plastic housing made in an IC technology. The key steps are to mount on a leadframe and wire bond semiconductor chips having Hall sensors, to place the leadframe in an injection mold, to close the injection mold with a first mold insert and to inject plastic material, wherein each semiconductor chip is packed into an intermediate casing including a flat surface having alignment structures. Then the injection mold is opened and a current conductor section is placed on the flat surface of each intermediate casing, the current conductor section having counter structures matching the alignment structures so that it is automatically aligned and held. Then the injection mold is closed with a second mold insert and plastic material injected to form the final housing of the current sensors. It is also possible to use two different injection molds.

20 Claims, 4 Drawing Sheets

Figure 1:
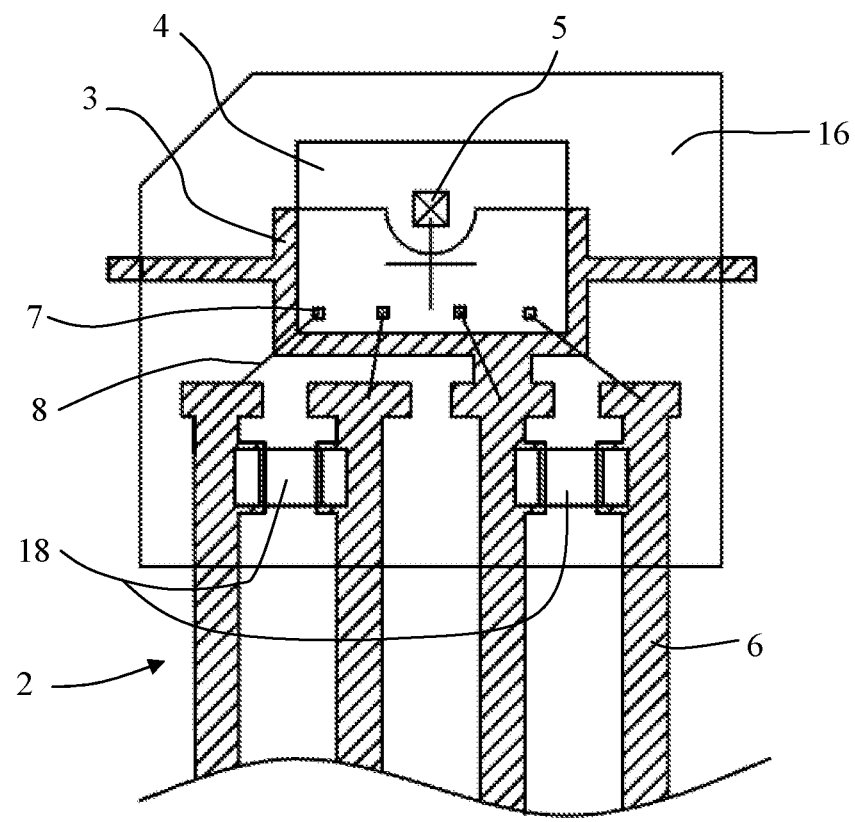

(51) Int. Cl.
*H01L 43/12* (2006.01)
*G01R 33/07* (2006.01)

(56) References Cited

U.S. PATENT DOCUMENTS

| | | |
|---|---|---|
| 2006/0152210 A1 | 7/2006 | Mangtani et al. |
| 2007/0018655 A1 | 1/2007 | Ausserlechner et al. |
| 2008/0237818 A1 | 10/2008 | Engel et al. |
| 2010/0141249 A1 | 6/2010 | Ararao et al. |
| 2012/0014069 A1 | 1/2012 | Zeng et al. |
| 2013/0020660 A1 | 1/2013 | Milano et al. |

METHOD OF MAKING CURRENT SENSORS

PRIORITY CLAIM

Applicant hereby claims foreign priority under 35 U.S.C §119 from Swiss Patent Application No. 00079/15 filed Jan. 22, 2015, the disclosure of which is herein incorporated by reference.

FIELD OF THE INVENTION

The invention relates to a method for the production of current sensors which comprise a plastic housing made in an IC technology, the current sensors having electrical terminals protruding from the housing and a current conductor through which the current to be measured flows protruding from the housing.

BRIEF DESCRIPTION OF THE DRAWING FIGURES

Figure 4:
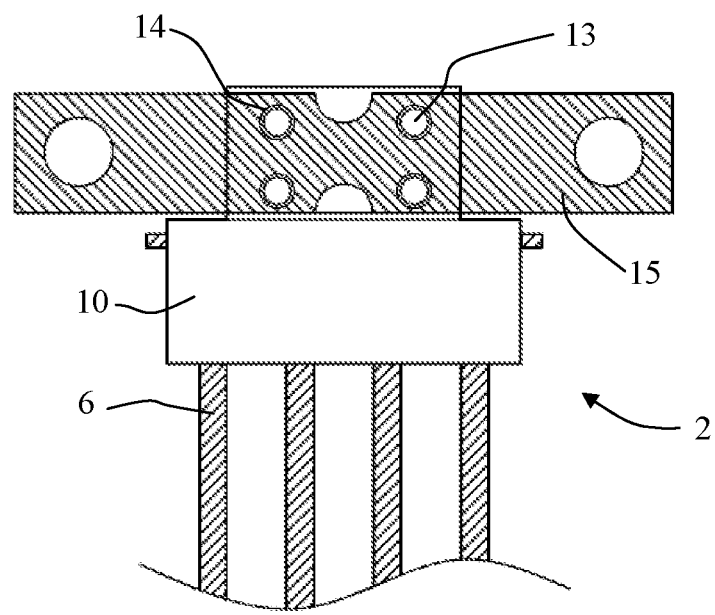
Figure 5:
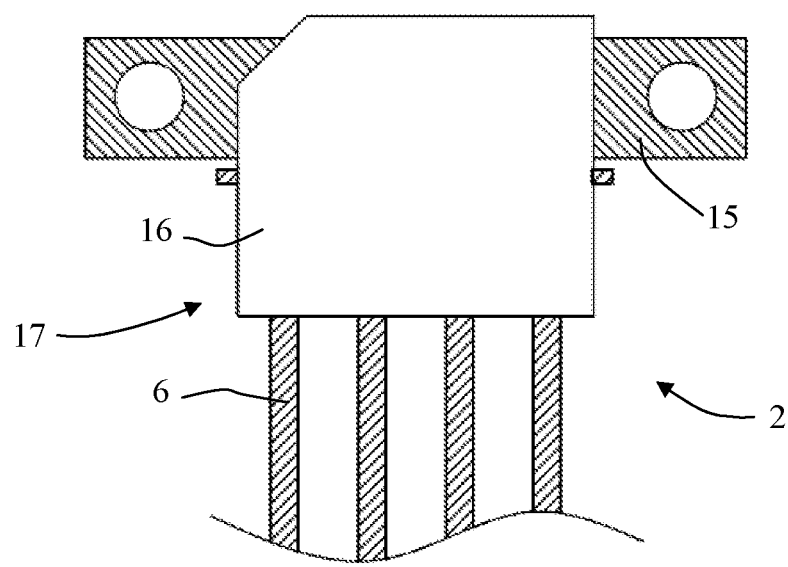
Figure 6:
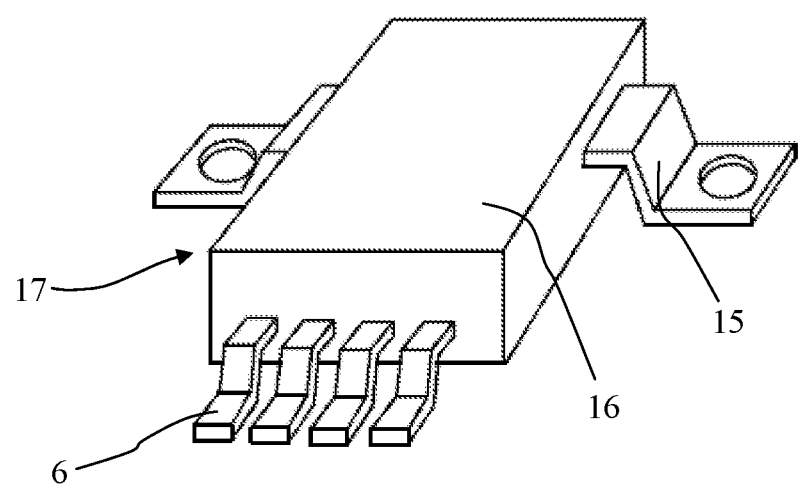

The accompanying drawings, which are incorporated into and constitute a part of this specification, illustrate one or more embodiments of the present invention and, together with the detailed description, serve to explain the principles and implementations of the invention. The figures are not drawn to scale. In the drawings:

FIGS. 1 to 5 show various snapshots of the production method according to the invention, and FIG. 6 shows a current sensor made with this method in a perspective view.

DETAILED DESCRIPTION OF THE INVENTION

Figure 2:
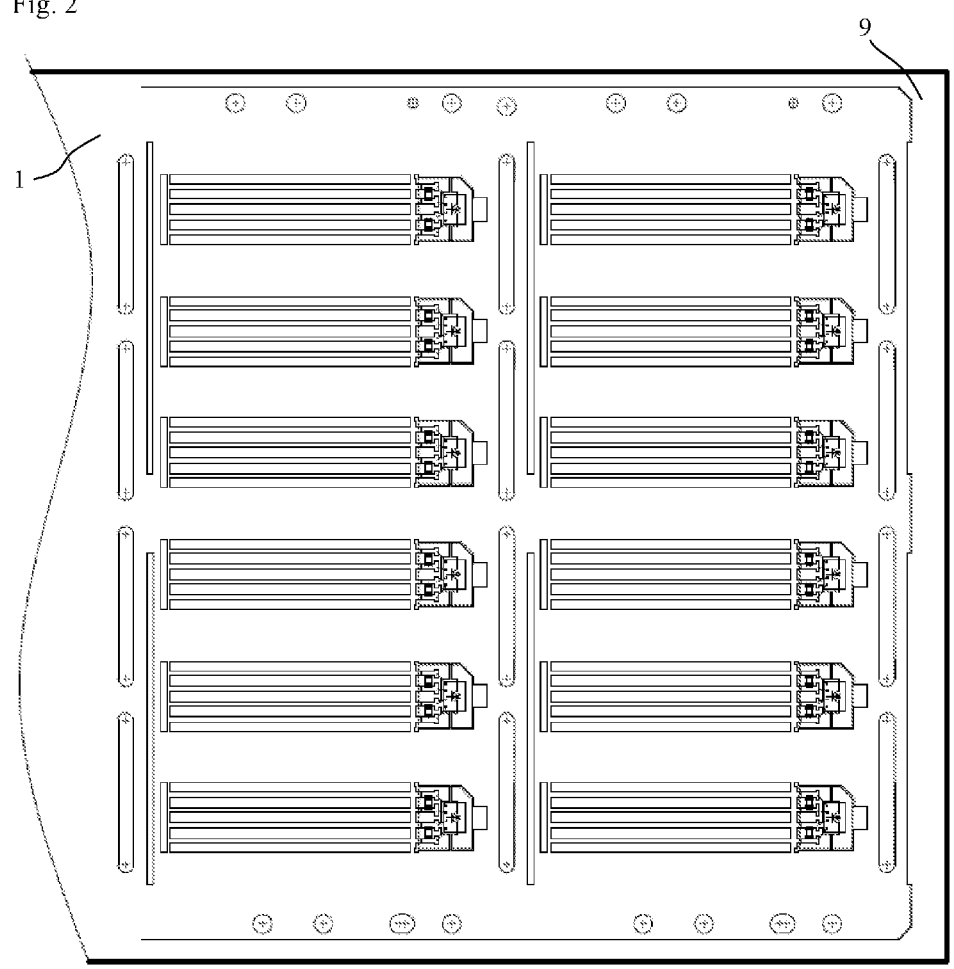
Figure 3:
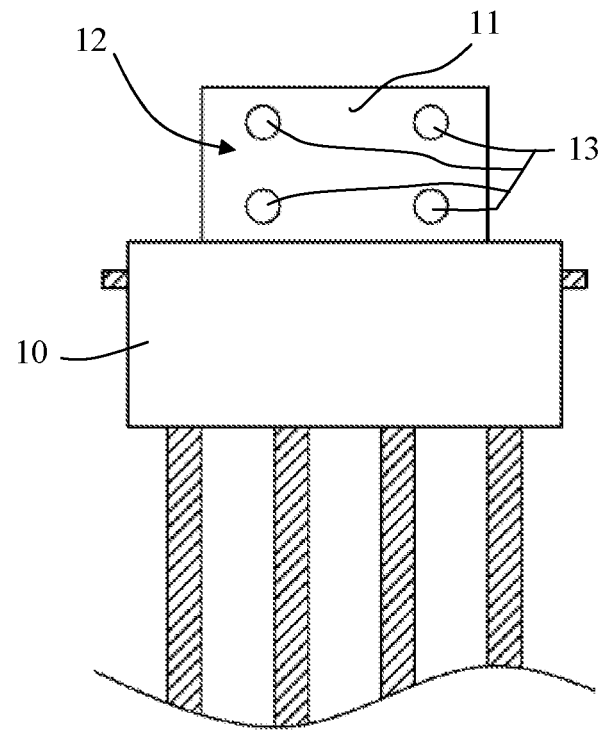

A first method according to the invention for the production of current sensors comprises the below explained steps A to K and is illustrated with FIGS. 1 to 5 which show snapshots in a plan view. FIG. 1 shows the state after step B. FIG. 2 shows the state after step C. FIG. 3 shows the state after step F. FIG. 4 shows the state after step G. FIG. 5 shows the state after step J. FIG. 6 shows a perspective view of a current sensor made with this method.

Starting point of the method is a leadframe 1 that includes a predetermined number of identical leadframe sections 2 from each of which a current sensor is formed. Each leadframe section 2 includes a support surface 3 for a semiconductor chip 4 having one or more integrated Hall sensor(s) 5 and electrical connection terminals 6. FIGS. 1, 2, 4 and 5 show parts of a single leadframe section 2 only, these parts drawn hatched and as usual connected to the not shown frame of the leadframe 1 (or simply to the leadframe 1).

The first method comprises the steps A to K, which are executed in the order given below:

A) Providing a leadframe 1 having chip supporting surfaces 3 and mounting a semiconductor chip 4 having one or more integrated Hall sensor(s) 5 on each of the supporting surfaces 3 of the leadframe 1;

B) Connecting electrical connection areas 7 of the semiconductor chips 4 with associated connection terminals 6 of the leadframe 1 by bonding wires 8;

FIG. 1 shows the state after this step wherein additionally the (not yet existing) final housing 16 is shown. In FIG. 1, optional passive components 18 are also shown.

C) Placing the leadframe 1 in an injection mold 9;

FIG. 2 shows the leadframe 1 placed in the injection mold 9.

D) Closing the injection mold 9 with a first mold insert having a molding surface provided with structures;

This structured molding surface faces the side of the leadframe 1 on which the semiconductor chips 4 are mounted.

E) Injecting plastic material into the injection mold 9 to package each semiconductor chip 4 and associated parts of the leadframe 1 in an associated intermediate casing 10, wherein the structures of the mold surface of the first mold insert form on each intermediate casing 10 a flat surface 11 having alignment structures 12;

The alignment structures 12 include for example four cams 13 projecting from the flat surface 11 of the intermediate casing 10 as shown in FIG. 3. The flat surface 11 is located above the semiconductor chip 4.

F) Opening the injection mold 9;

FIG. 3 shows a single leadframe section 2 after this step. The parts of the leadframe section 2 protruding on the left and right side of the intermediate casing 10 are still connected with the leadframe 1, but this is not shown for the sake of illustrative clarity.

G) Placing a current conductor section 15 on the flat surfaces 11 of the intermediate casings 10, wherein each current conductor section 15 is formed with counter structures 14 matching the alignment structures 12, so that the current conductor section 15 is automatically aligned and held;

FIG. 4 shows the leadframe section 2 after this step. With the embodiment shown here, the counter structures 14 are four recesses in which the cams 13 precisely fit, i.e. engage practically without clearance. Such a current conductor section 15 is in the technical field also known as current conductor or current clip.

H) Closing the injection mold 9 with a second mold insert;

I) Injecting plastic material into the injection mold 9 to connect the current conductor sections 15 with the associated intermediate casing 10 and form the final housings 16 of the current sensors 17;

J) Opening the injection mold 9 and removing the leadframe 1 from the injection mold 9;

FIG. 5 shows the leadframe section 2 after this step. The parts of the leadframe section 2 protruding on the left and right side of the intermediate casing 10 are still connected with the leadframe 1—although not shown here. and K) Singulating the current sensors 17.

Therefore, the leadframe sections 2 are connected with the leadframe 1 until and including step J. In the singulating process the current sensors 17 are separated from the no longer needed parts of the leadframe 1, typically by one or more stamping processes. If desired, the connection terminals 6 protruding from the housing 16 and also the current conductor sections 15 are then bent. Those parts of the leadframe sections 2 which connect the support surfaces 3 for the semiconductor chip 4 with the leadframe 1 are preferably placed such that in the separation step the stamping tool passes the current conductor section 15 without contact.

A second method according to the invention comprises the steps A bis F of the first method according to the invention, wherein the named injection mold 9 is a first injection mold, and and then the following steps G to L, which are executed in the order given below:

G) Removing the leadframe 1 from the first injection mold, transporting the leadframe 1 to a second injection mold and placing the leadframe 1 in the second injection mold;

H) Placing a current conductor section 15 on the flat surfaces 11 of the intermediate casings 10, wherein each current conductor section 15 is formed with counter structures 14 matching the alignment structures 12 so that the current conductor section 15 is automatically aligned and held;

I) Closing the second injection mold;

J) Injecting plastic material into the second injection mold to connect the current conductor sections 15 with the associated intermediate casing 10 and form the final housings 16 of the current sensors 17;

K) Opening the second injection mold and removing the leadframe 1 from the second injection mold; and L) Singulating the current sensors 17.

The second injection mold is closed with a mold insert corresponding to the shape of the final housings. This mold insert is therefore equal to the second mold insert in the first method.

The two methods are also suitable to integrate—one or more—passive components 18 (FIG. 1) into the housing 16 of the current sensor 17. The passive components 18 can be mounted on the leadframe 1 either before step C or D and also packed into the intermediate casing 10 in step E, or with the first method mounted on the leadframe 1 before step H and also packed into the final housing 16 in step I, or with the second method mounted on the leadframe 1 before step I and also packed into the final housing 16 in step J, respectively.

Furthermore, before the step of placing a current conductor section 15 on the flat surfaces 11 of the intermediate casings 10, an electrical isolator can be placed on the flat surfaces 11 of the intermediate casings 10, wherein the isolators are formed with counter structures matching the alignment structures 12 and are aligned by means of the alignment structures 12, or an electrically isolating tape can be applied to the current conductor section 15 on the side facing the semiconductor chip 4. Furthermore, the side of the current conductor section 15 facing the semiconductor chip 4 can be covered with electrically isolating material. The electrical isolators or tapes or this layer, respectively, consist of another material than the plastic material used for the intermediate casing 10 and the final housing 16.

Furthermore, after the step of placing a current conductor section 15 on the flat surfaces 11 of the intermediate casings 10, a ferromagnetic sheet of metal can be placed on each current conductor section 15. The ferromagnetic sheet of metal is used to amplify the magnetic field produced by the current flowing through the current conductor section 15. The ferromagnetic sheet of metal and the current conductor section 15 are advantageously formed such that the ferromagnetic sheet of metal can be fixed to the current conductor section 15.

The current conductor sections 15 can be—as shown—single parts that are planar or already bent into a form suitable for the later use. But the current conductor sections 15 can also be part of a further leadframe and then be separated also in step K or L, respectively.

Advantageously, the plastic material used for making the final housings is the same as the plastic material used for making the intermediate casings.

The invention claimed is:

1. Method for making current sensors, the method comprising the following steps executed in the order given below:

A) providing a leadframe having chip supporting surfaces and mounting a semiconductor chip having one or more integrated Hall sensors on each of the chip supporting surfaces of the leadframe, B) connecting electrical connection areas of the semiconductor chips with associated connecting terminals of the leadframe by bonding wires, C) placing the leadframe in an injection mold, D) closing the injection mold with a first mold insert having a molding surface provided with structures, E) injecting plastic material into the injection mold to package each semiconductor chip and associated parts of the leadframe in an associated intermediate casing, wherein the structures of the mold surface of the first mold insert form on each intermediate casing a flat surface having alignment structures, F) opening the injection mold, G) placing a current conductor section on the flat surfaces of the intermediate casings, wherein each current conductor section is formed with counter structures matching the alignment structures, so that the current conductor section is automatically aligned and held, H) closing the injection mold with a second mold insert, I) injecting plastic material into the injection mold to connect the current conductor sections with the associated intermediate casing and form the final housings of the current sensors, J) opening the injection mold and removing the leadframe from the injection mold, and K) singulating the current sensors.

2. Method according to claim 1, further comprising
before step D: mounting passive components on the leadframe, and
in step E: packing also the passive components into the intermediate casing.

3. Method according to claim 2, further comprising before the step of placing a current conductor section on the flat surfaces of the intermediate casings:
placing an electrical isolator on the flat surfaces of the intermediate casings, wherein each isolator is formed with counter structures matching the alignment structures so that the isolator is automatically aligned and held, or mounting an electrically isolating tape on the current conductor section on a side facing the semiconductor chip.

4. Method according to claim 3, further comprising using the same plastic material for making the intermediate casings and the final housings.

5. Method according to claim 1, further comprising
before step H: mounting passive components on the leadframe, and
in step I: packing also the passive components into the final housing.

6. Method according to claim 5, further comprising before the step of placing a current conductor section on the flat surfaces of the intermediate casings:
placing an electrical isolator on the flat surfaces of the intermediate casings, wherein each isolator is formed with counter structures matching the alignment structures so that the isolator is automatically aligned and held, or mounting an electrically isolating tape on the current conductor section on a side facing the semiconductor chip.

7. Method according to claim 6, further comprising after the step of placing a current conductor section on the flat surfaces of the intermediate casings: placing a ferromagnetic sheet of metal on each current conductor section.

8. Method according to claim 1, further comprising before the step of placing a current conductor section on the flat surfaces of the intermediate casings:
placing an electrical isolator on the flat surfaces of the intermediate casings, wherein each isolator is formed with counter structures matching the alignment structures so that the isolator is automatically aligned and held, or mounting an electrically isolating tape on the current conductor section on a side facing the semiconductor chip.

9. Method according to claim 8, further comprising using the same plastic material for making the intermediate casings and the final housings.

10. Method according to claim 1, further comprising using the same plastic material for making the intermediate casings and the final housings.

11. Method for making current sensors, the method comprising the following steps executed in the order given below:
    A) providing a leadframe having chip supporting surfaces and mounting a semiconductor chip having one or more integrated Hall sensors on each of the chip supporting surfaces of the leadframe,
    B) connecting electrical connection areas of the semiconductor chips with associated connecting terminals of the leadframe by bonding wires,
    C) placing the leadframe in a first injection mold,
    D) closing the first injection mold with a first mold insert having a molding surface provided with structures,
    E) injecting plastic material into the first injection mold to package each semiconductor chip and associated parts of the leadframe in an associated intermediate casing, wherein the structures of the mold surface of the first mold insert form on each intermediate casing a flat surface having alignment structures,
    F) opening the first injection mold,
    G) removing the leadframe from the first injection mold, transporting the leadframe to a second injection mold and placing the leadframe in the second injection mold;
    H) placing a current conductor section on the flat surfaces of the intermediate casings, wherein each current conductor section is formed with counter structures matching the alignment structures, so that the current conductor section is automatically aligned and held,
    I) closing the second injection mold with a second mold insert,
    J) injecting plastic material into the second injection mold to connect the current conductor sections with the associated intermediate casing and form the final housings of the current sensors,
    K) opening the second injection mold and removing the leadframe from the second injection mold, and
    L) singulating the current sensors.

12. Method according to claim 11, further comprising
before step D: mounting passive components on the leadframe, and
in step E: packing also the passive components into the intermediate casing.

13. Method according to claim 12, further comprising before the step of placing a current conductor section on the flat surfaces of the intermediate casings:
    placing an electrical isolator on the flat surfaces of the intermediate casings, wherein each isolator is formed with counter structures matching the alignment structures so that the isolator is automatically aligned and held, or mounting an electrically isolating tape on the current conductor section on a side facing the semiconductor chip.

14. Method according to claim 13, further comprising using the same plastic material for making the intermediate casings and the final housings.

15. Method according to claim 11, further comprising
    before step I: mounting passive components on the leadframe, and
    after step J: packing also the passive components into the intermediate casing.

16. Method according to claim 15, further comprising before the step of placing a current conductor section on the flat surfaces of the intermediate casings:
    placing an electrical isolator on the flat surfaces of the intermediate casings, wherein each isolator is formed with counter structures matching the alignment structures so that the isolator is automatically aligned and held, or mounting an electrically isolating tape on the current conductor section on a side facing the semiconductor chip.

17. Method according to claim 16, further comprising after the step of placing a current conductor section on the flat surfaces of the intermediate casings: placing a ferromagnetic sheet of metal on each current conductor section.

18. Method according to claim 11, further comprising before the step of placing a current conductor section on the flat surfaces of the intermediate casings:
    placing an electrical isolator on the flat surfaces of the intermediate casings, wherein each isolator is formed with counter structures matching the alignment structures so that the isolator is automatically aligned and held, or mounting an electrically isolating tape on the current conductor section on a side facing the semiconductor chip.

19. Method according to claim 18, further comprising using the same plastic material for making the intermediate casings and the final housings.

20. Method according to claim 11, further comprising using the same plastic material for making the intermediate casings and the final housings.

* * * * *